(12) United States Patent
Yuan

(10) Patent No.: US 10,528,101 B2
(45) Date of Patent: Jan. 7, 2020

(54) HEAT CONTROL METHOD AND DEVICE

(71) Applicant: ZTE Corporation, Shenzhen (CN)

(72) Inventor: Biao Yuan, Shenzhen (CN)

(73) Assignee: XI'AN ZHONGXING NEW SOFTWARE CO., LTD., Shaanxi (CN)

( * ) Notice: Subject to any disclaimer, the term of this patent is extended or adjusted under 35 U.S.C. 154(b) by 119 days.

(21) Appl. No.: 15/570,594

(22) PCT Filed: Aug. 6, 2015

(86) PCT No.: PCT/CN2015/086280
§ 371 (c)(1),
(2) Date: Oct. 30, 2017

(87) PCT Pub. No.: WO2016/173140
PCT Pub. Date: Nov. 3, 2016

(65) Prior Publication Data
US 2018/0150116 A1 May 31, 2018

(30) Foreign Application Priority Data
Apr. 28, 2015 (CN) .......................... 2015 1 0208500

(51) Int. Cl.
G06F 1/20 (2006.01)
H05K 7/20 (2006.01)
(Continued)

(52) U.S. Cl.
CPC .............. *G06F 1/206* (2013.01); *G01B 7/02* (2013.01); *G06F 1/203* (2013.01); *H05K 7/20* (2013.01);
(Continued)

(58) Field of Classification Search
CPC ........... G06F 1/203; G06F 1/206; G01B 7/02; G01B 7/023; H05K 7/20; H05K 7/2039; F28F 2013/005; F28F 2013/008
See application file for complete search history.

(56) References Cited

U.S. PATENT DOCUMENTS

2006/0059056 A1* 3/2006 Tsuchida ............ H03K 17/9505
324/207.15
2006/0126299 A1 6/2006 Park
(Continued)

FOREIGN PATENT DOCUMENTS

CN 101247715 A 8/2008
CN 101517496 A 8/2009
(Continued)

OTHER PUBLICATIONS

International Search Report for corresponding application PCT/CN2015/086280 filed on Aug. 6, 2015; dated Jan. 25, 2016.
(Continued)

Primary Examiner — Marc E Norman
(74) Attorney, Agent, or Firm — Cantor Colburn LLP

(57) ABSTRACT

A heat control method and device are provided. In the method, a distance or distances between one or more regions of a terminal and a predetermined detection object may be detected (S102); heat insulation processing may be performed in a first region of the terminal, where the first region may be a region of which the distance to the predetermined detection object is smaller than a first predetermined threshold; and/or, heat dissipation processing may be performed in a second region of the terminal, where the second region may be a region of which the distance to the predetermined detection object is larger than a second predetermined threshold (S104).

20 Claims, 5 Drawing Sheets

(51) Int. Cl.
  *G01B 7/02* (2006.01)
  *F28F 13/00* (2006.01)
(52) U.S. Cl.
  CPC ...... *H05K 7/2039* (2013.01); *F28F 2013/005* (2013.01); *F28F 2013/008* (2013.01)

(56) References Cited

U.S. PATENT DOCUMENTS

| | | |
|---|---|---|
| 2011/0251733 A1 | 10/2011 | Atkinson |
| 2012/0182687 A1 | 7/2012 | Dighde |
| 2014/0011448 A1* | 1/2014 | Yang ................. H04B 5/00 455/41.1 |
| 2014/0192480 A1 | 7/2014 | Winkler |
| 2014/0262128 A1 | 9/2014 | Barnes |
| 2015/0369467 A1* | 12/2015 | Saito ................. H05K 3/305 362/345 |

FOREIGN PATENT DOCUMENTS

| | | |
|---|---|---|
| CN | 201550395 U | 8/2010 |
| CN | 102246118 A | 11/2011 |
| CN | 102573417 A | 7/2012 |
| CN | 103025122 A | 4/2013 |
| CN | 103186213 A | 7/2013 |
| CN | 203633030 U | 6/2014 |
| CN | 104182016 A | 12/2014 |
| EP | 2096517 A2 | 9/2009 |
| JP | 2000253115 A | 9/2000 |
| WO | 2014098788 A1 | 6/2014 |

OTHER PUBLICATIONS

European Search Report for corresponding application 15 890 516.6; dated Mar. 14, 2018.

* cited by examiner

HEAT CONTROL METHOD AND DEVICE

TECHNICAL FIELD

The disclosure relates to the field of communications, and particularly to a heat control method and device.

BACKGROUND

Terminal products, especially intelligent machines, have developed with rapid changes, starting five years ago. Nowadays, there are various kinds of terminal products with more and more powerful functions. Processors of terminals are also developed from single-core to dual-core, four-core and even current eight-core. Main frequencies are also increased from hundreds of megabytes to 2.5 GHz. Cameras are developed from 300,000 pixels to current 16,000,000 pixels and even more than 40,000,000 pixels. With such powerful and stunning configurations, a small intelligent terminal may completely realize functions of a computer, or may even be more powerful.

However, at the same time of configuration enhancement of a terminal product, there some problems challenging research and development personnel. Among all the problems, a heating problem is a major problem challenging the project research and development personnel. Development from a single-core processor to a current eight-core processor does not obviously enlarge the size of the processor, but increases cores several times and also increases a main frequency several times, which inevitably brings a bigger heating problem. There may exist various concurrent conditions when a user uses a terminal product. For example, when an online game is played during charging, a main chip may generate heat due to high-frequency operation, a charging chip may generate heat due to high-current charging, a radio frequency power amplifier may generate heat due to high-power work, a memory may generate heat due to data reading and writing, a Liquid Crystal Display (LCD) may generate heat due to constant turning-on of a screen, and various kinds of heating may be compounded to make the heating problem more troublesome. At present, terminal products are developed towards lightening and thinning the products, so that parts in a terminal are more closely deployed, which often exacerbates the heating problem of the terminal products.

For example, when a user is playing a game using a terminal, a main chip of the terminal may generate more heat. If no measures are taken, a high-temperature extremely hot point may be formed at a housing position corresponding to the main chip, a user may directly feel the high temperature, and a user experience may be influenced. For a terminal product, a final purpose for solving the heating problem is to guarantee a good user experience. Therefore, solving the heating problem is a problem to be solved.

If the heating problem is not solved, a most direct problem is to cause a poor user experience and a complaint of the user. If the heating problem is not solved, the main chip may also be overheated to cause frequency reduction, thereby causing reduction of performance and even system halt to dissatisfy the user. If the heating problem is not solved, serious heating may cause a safety problem, therefore, the heating problem should be solved. However, there is no solution capable of effectively solving the heating problem of the terminal product.

For a problem of incapability in effectively solving heating of a terminal product, there is yet no effective solution at present.

SUMMARY

Some embodiments of the disclosure provide a heat control method and device, which may at least solve a problem of incapability in solving heating of a terminal product.

According to an embodiment of the disclosure, a heat control method is provided, which may include the following acts. A distance or distances between one or more regions of a terminal and a predetermined detection object may be detected. Heat insulation processing may be performed in a first region of the terminal, where the first region may be a region of which the distance to the predetermined detection object is smaller than a first predetermined threshold; and/or, heat dissipation processing may be performed in a second region of the terminal, where the second region may be a region of which the distance to the predetermined detection object is larger than a second predetermined threshold.

In an embodiment of the disclosure, the act of performing heat insulation processing in the first region of the terminal may include the following act. Stepped heat insulation processing may be performed in the first region according to distances to the predetermined detection object.

In an embodiment of the disclosure, the act of performing stepped heat insulation processing in the first region according to the distances to the predetermined detection object may include the following act. Stepped heat insulation processing may be performed in a manner of respectively controlling each grid sub-block in the first region. In the embodiment, the first region may include a predetermined number of grid sub-blocks, and electrodes configured to control heat may be arranged in the grid sub-blocks.

In an embodiment of the disclosure, after the act that the distance or distances between the one or more regions of the terminal and the predetermined detection object are detected, the method may further include the following act. When a distance between each region of the terminal and the predetermined detection object is larger than a third predetermined threshold, heat equalization processing may be performed in the terminal.

In an embodiment of the disclosure, the act of detecting the distance or distances between the one or more regions of the terminal and the predetermined detection object may include the following act. The distance or distances between the one or more regions of the terminal and the predetermined detection object may be determined based on a change of a numerical value in a proximity sensor and/or a change of a numerical value in a capacitive sensor.

According to another embodiment of the disclosure, a heat control device is provided, which may include a detection module, and may further include a first processing module and/or a second processing module. The detection module may be configured to detect a distance or distances between one or more regions of a terminal and a predetermined detection object. The first processing module may be configured to perform heat insulation processing in a first region of the terminal, where the first region may be a region of which the distance to the predetermined detection object is smaller than a first predetermined threshold. The second processing module may be configured to perform heat dissipation processing in a second region of the terminal, where the second region may be a region of which the distance to the predetermined detection object is larger than a second predetermined threshold.

In an embodiment of the disclosure, the first processing module may include a processing unit. The processing unit may be configured to perform stepped heat insulation processing in the first region according to distances to the predetermined detection object.

In an embodiment of the disclosure, the processing unit may be configured to: perform stepped heat insulation processing in a manner of respectively controlling each grid sub-block in the first region. The first region may include a predetermined number of grid sub-blocks, and electrodes configured to control heat may be arranged in the grid sub-blocks.

In an embodiment of the disclosure, the device may further include a third processing module. The third processing module may be configured to, when a distance between each region of the terminal and the predetermined detection object is larger than a third predetermined threshold, perform heat equalization processing in the terminal.

In an embodiment of the disclosure, the detection module may be configured to: determine the distance or distances between the one or more regions of the terminal and the predetermined detection object based on a change of a numerical value in a proximity sensor and/or a change of a numerical value in a capacitive sensor.

The distance or distances between the one or more regions of the terminal and the predetermined detection object may be detected. Heat insulation processing may be performed in the first region of the terminal, where the first region is the region of which the distance to the predetermined detection object is smaller than the first predetermined threshold; and/or, heat dissipation processing may be performed in the second region of the terminal, where the second region is the region of which the distance to the predetermined detection object is larger than the second predetermined threshold. By virtue of the solution in some embodiments of the disclosure, a problem of incapability in solving heating of a terminal product may be solved, and an effect of effectively solving a problem of heating of the terminal product may be achieved.

DETAILED DESCRIPTION OF THE EMBODIMENTS

It is important to note that terms "first", "second" and the like in the specification, claims and drawings of the disclosure are adopted not to describe a specific sequence or order but to distinguish similar objects.

Figure 1:
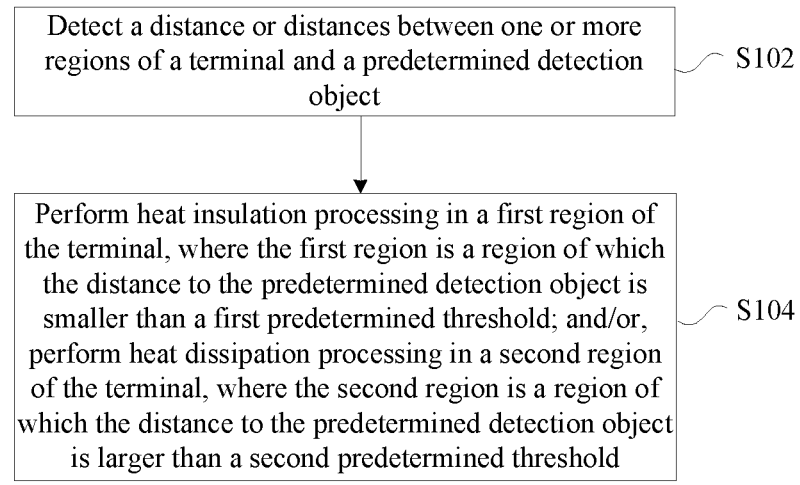
FIG. 1 is a flowchart of a heat control method according to an embodiment of the disclosure.

An embodiment provides a heat control method. FIG. 1 is a flowchart of a heat control method according to an embodiment of the disclosure. As shown in FIG. 1, the flow may include the following acts:

At act S102, a distance or distances between one or more regions of a terminal and a predetermined detection object may be detected.

At act S104, heat insulation processing may be performed in a first region of the terminal, where the first region may be a region of which the distance to the predetermined detection object is smaller than a first predetermined threshold; and/or, heat dissipation processing may be performed in a second region of the terminal, where the second region may be a region of which the distance to the predetermined detection object is larger than a second predetermined threshold.

In an embodiment, the first predetermined threshold may be equal to the second predetermined threshold, and may alternatively be smaller than the second predetermined threshold. By the acts, the terminal may be divided into different regions, and corresponding heat processing may be performed based on distances between the divided regions and the predetermined detection object. Heat insulation processing may be performed in the regions close to the predetermined detection object, so that the predetermined detection object (for example, a face) may not feel any obvious temperature rise. Heat dissipation processing may be performed in the regions relatively far away from the predetermined detection object, so that heat produced by the terminal product may be timely and effectively dissipated, avoiding reduction of an experience and influence on operational performance of the terminal product. A problem of incapability in solving heating of the terminal product may be solved, an effect of effectively solving a problem of heating of the terminal product may be achieved, and meanwhile, the user experience may be effectively improved.

In order to better improve the user experience, in an exemplary embodiment, stepped heat insulation processing may be performed in the region subjected to heat insulation according to distances to the predetermined detection object. For example, in the first region, heat insulation processing of a maximal degree may be performed at a position closest to the predetermined detection object (a position with which the predetermined detection object may contact), heat insulation processing of a lower degree may be performed at a more distant position, and heat insulation processing of a minimal degree may be performed at a most distant position. Similarly, for heat dissipation processing, stepped heat dissipation processing may also be performed. For example, in the second region, heat dissipation processing of a minimal degree may be performed at a position closest to the predetermined detection object, heat dissipation processing of a higher degree may be performed at a more distant position, and heat dissipation processing of a maximal degree may be performed at a most distant position.

Each region of the terminal may be divided into a predetermined number of grid sub-blocks (that is, each region may be divided into multiple sub-blocks, and there may be various selection for the shape of each sub-block, for example, the sub-block may be a square sub-block, or a rectangular sub-block or a hexagonal sub-block). Heat insulation or heat dissipation processing over each region may be substantially the control over each grid sub-block. In an exemplary embodiment, the act of performing stepped heat insulation processing in the first region according to the distances to the predetermined detection object may include the following act: Stepped heat insulation processing may be performed in a manner of respectively controlling each grid sub-block in the first region. The first region may include a predetermined number of grid sub-blocks, and electrodes configured to control heat may be arranged in the grid sub-blocks (for example, an electrode may be arranged on each of upper and lower sides of each grid sub-block, and heat insulation or heat dissipation processing may be performed by virtue of migration of electrons between the two electrodes). Control over heat insulation or heat dissipation may be implemented by controlling directions of migration of the electrons between the electrodes arranged in the grid sub-blocks. Of course, performing heat insulation and heat dissipation processing by virtue of migration of the electrons is only one optional processing manner, and heat insulation and heat dissipation processing may alternatively be performed in another manner, which will not be elaborated herein.

In an exemplary embodiment, after the act that the distance or distances between the one or more regions of the terminal and the predetermined detection object are detected, the method may further include the following act: When it is determined that a distance between each region of the terminal and the predetermined detection object is larger than a third predetermined threshold, heat equalization processing may be performed in the terminal. In the embodiment, the third predetermined threshold may be equal to the second predetermined threshold, and may alternatively be larger than the second predetermined threshold. During a specific application, when a distance between each region of the terminal and the predetermined detection object is larger than the third predetermined threshold, for example, the predetermined detection object (for example, a hand or the face) does not touch the terminal, at this moment, no matter which part of the terminal is subjected to heat dissipation, there is no influence on the user experience. Therefore, balanced heat dissipation may be performed on each region of the terminal, which not only avoids the influence on the user experience but also may improve heat dissipation efficiency.

In an embodiment, before heat insulation and heat dissipation processing is performed, a distance between the predetermined detection object and the terminal may be detected at first. There may be multiple detection manners. In an exemplary embodiment, the act of detecting the distance or distances between the one or more regions of the terminal and the predetermined detection object may include the following act: The distance or distances between the one or more regions of the terminal and the predetermined detection object may be determined based on a change of a numerical value in a proximity sensor and/or a change of a numerical value in a capacitive sensor. Descriptions will be made with detection of the distance or distances between the one or more regions of the terminal and the predetermined detection object (for example, which may be the face) by virtue of the capacitive sensor as an example. When a call is being made, the face of the user may get close to a touch screen of the terminal (a touch screen region covered by the face of the user may be considered as a region of the terminal). Under such a condition, a face region getting close to the touch screen may be approximately considered as a plane. When the face gets close to the touch screen, the numerical value of the capacitive sensor in the touch screen may change, a position where the numerical value changes most indicates a position, which is closest to the touch screen, of the face, and a position where the numerical value changes least indicates a position, being farthest away from the touch screen, of the face. In such a manner, a range of a distance between the plane of the face and a plane of the touch screen may be determined as, for example, Xmm-Ymm. When Ymm is smaller than the first predetermined threshold, it may be indicated that all regions, covered by the face (contact is not necessary), of the touch screen are smaller than the first predetermined threshold, and heat insulation processing may be required to be performed in the regions. When Xmm is larger than the second predetermined threshold, it may be indicated that all the regions, covered by the face (contact is not necessary), of the touch screen are larger than the second predetermined threshold, it may be indicated that the face is far enough away from the touch screen, and heat dissipation processing may be performed in the regions. Of course, the regions, covered by the face (contact is not necessary), of the touch screen may not only include regions with a heat insulation requirement but also include regions with a heat dissipation requirement. Therefore, region division may be further performed on the regions of the touch screen, and corresponding heat insulation or heat dissipation processing may be performed on the divided regions.

From the above descriptions about the implementation modes, those skilled in the art may clearly know that the method according to the embodiment may be implemented in a manner of combining software and a necessary universal hardware platform, and of course, may alternatively be implemented by hardware, and the former may be a better implementation mode under many conditions. Based on such an understanding, the technical solution of the disclosure substantially or a part making contributions to a conventional art may be embodied in form of software product. The computer software product may be stored in a storage medium (such as a Read-Only Memory (ROM)/Random Access Memory (RAM), a magnetic disk and an optical disk), including a plurality of instructions configured to enable a piece of terminal equipment (which may be a mobile phone, a computer, a server, network equipment or the like) to execute the method of each embodiment of the disclosure.

Another embodiment provides a heat control device. The device may be configured to implement the abovementioned embodiment and implementation mode, and what has been described will not be elaborated. For example, term "module", used below, may be a combination of software and/or hardware capable of realizing a predetermined function. Although the device described in the following embodiment may be preferably implemented by software, implementation with hardware or a combination of the software and the hardware may also be possible and conceivable.

Figure 2:
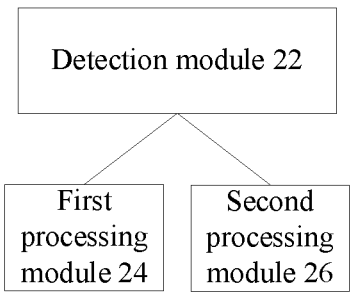
FIG. 2 is a structure block diagram of a heat control device according to an embodiment of the disclosure.

FIG. 2 is a structure block diagram of a heat control device according to an embodiment of the disclosure. As shown in FIG. 2, the device may include a detection module 22, a first processing module 24 and a second processing module 26. The device will be described below.

The detection module 22 may be configured to detect a distance or distances between one or more regions of a terminal and a predetermined detection object. The first processing module 24 may be coupled to the detection module 22, and may be configured to perform heat insulation processing in a first region of the terminal, where the first region may be a region of which the distance to the predetermined detection object is smaller than a first predetermined threshold; and/or, the second processing module 26 may be coupled to the detection module 22, and may be configured to perform heat dissipation processing in a second region of the terminal, where the second region may be a region of which the distance to the predetermined detection object is larger than a second predetermined threshold.

Figure 3:
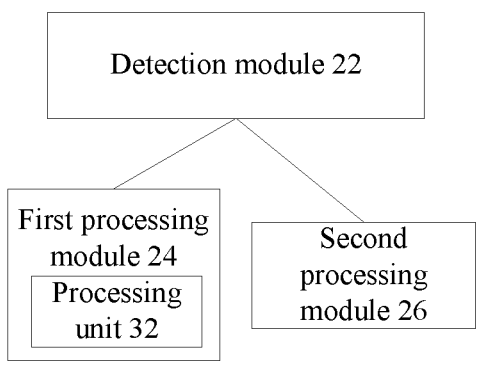
FIG. 3 is a structure block diagram of a first processing module in a heat control device according to an embodiment of the disclosure.

FIG. 3 is a structure block diagram of a first processing module 24 in a heat control device according to an embodiment of the disclosure. As shown in FIG. 3, the first processing module 24 may include a processing unit 32. The first processing module 24 will be described below.

The processing unit 32 may be configured to perform stepped heat insulation processing in the first region according to distances to the predetermined detection object.

In an exemplary embodiment, the processing unit 32 may be configured to perform stepped heat insulation processing in a manner of respectively controlling each grid sub-block in the first region. In the exemplary embodiment, the first region may include a predetermined number of grid sub-blocks, and electrodes configured to control heat may be arranged in the grid sub-blocks.

Figure 4:
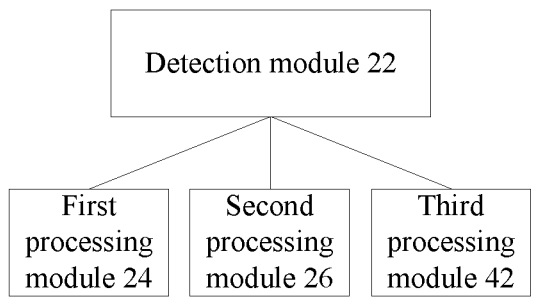
FIG. 4 is another structure block diagram of a heat control device according to an embodiment of the disclosure.

FIG. 4 is another structure block diagram of a heat control device according to an embodiment of the disclosure. As shown in FIG. 4, the device may further include a third processing module 42, besides modules shown in FIG. 2. The device will be described below.

The third processing module 42 may be coupled to the detection module 22, and may be configured to, when a distance between each region of the terminal and the predetermined detection object is larger than a third predetermined threshold, perform heat equalization processing in the terminal.

In an exemplary embodiment, the detection module 22 may be configured to determine the distance or distances between the one or more regions of the terminal and the predetermined detection object based on a change of a numerical value in a proximity sensor and/or a change of a numerical value in a capacitive sensor.

From the concept of a modular design of a terminal product, for a purpose of improving a user experience and in combination with "throttling" and "insulation" methods, an embodiment of the disclosure provides an intelligent heat dissipation device for a terminal. The device may be divided into two layers. One layer may be a heat equalization element layer, and the other layer may be a heat insulation/heat conduction element layer. The heat equalization element layer may be close to a heat source, the heat insulation/heat conduction element layer may be far away from the heat source, and the two layers may be closely combined.

Descriptions will be made with the condition that the predetermined detection object is a hand or face of an operator of the terminal as an example.

The heat equalization element layer may be a thin layer filled with a substance with a high specific heat capacity (for example, a layer with a thickness smaller than a predetermined value, e.g., 0.16 mm may be considered as a thin layer, and during a practical application, the substance of a 0.05 mm thickness may be filled). Adopting the substance with the high specific heat capacity may be beneficial for absorbing more heat by the substance of the layer and decreasing the rate of the rise in temperature, so that a user may not obviously feel a fast temperature rise, thereby improving the user experience. For example, the user experience under a situation where temperature of a terminal rises from a room temperature of 25° C. to 50° C. within 20 minutes, is better than the user experience under a situation where temperature of a terminal rises from 25° C. to 50° C. within 10 minutes. In addition, a position of a heat source on a main board may be not fixed, temperatures of some positions may be high, while temperatures of some positions may be low. For example, when an online game is played, a temperature of a position of a main chip may be high, and a temperature of a radio frequency power amplification chip may be high. The heat equalization element layer may be adopted to uniformly dissipate heat of an extremely hot point and occurrence of the extremely hot point, which may be greatly beneficial to improvement of the user experience. Therefore, adopting the heat equalization element layer may effectively decrease the temperature rise speed, and may also uniformly dissipate heat of the heat source and avoid occurrence of the very hot point.

The heat insulation/heat conduction element layer may be formed by a plane layer and an intelligent control chip. The plane layer may be divided into a plurality of grids, and a substance in the grids may be converted between heat insulation and heat conduction attributes. The control chip may communicate with the main chip to acquire current user scenario information and acquire a change of a capacitance value of a capacitive screen and a response of a proximity sensor, and may sketch (determine) a position of an operator of an intelligent product (the position of the operator of the intelligent product may be a position/positions of a hand and/or face of the operator, and descriptions are made below with the hand and/or face of the operator as an example). Then, corresponding positions of the hand and the face may be filled with a heat insulation substance, and corresponding positions except the hand or the face may be filled with a heat conduction substance, thereby implementing "throttling" and "insulation" of heat to implement intelligent heat dissipation. Meanwhile, the intelligent chip may regulate the heat insulation/heat conduction unit grids according to non-uniform temperatures of the heat insulation/heat conduction element layer, thereby making heat felt by the user consistent and finally achieving the final purpose of improving the user experience. The heat insulation/heat conduction unit will be described below in detail.

The plane layer of the heat insulation/heat conduction element layer may be a thin layer (for example, a layer with a thickness smaller than a predetermined value, e.g., 0.16 mm may be considered as a thin layer, and during a practical application, the plane layer may be 0.05 mm thick), and may be transversely and vertically divided into a plurality of grid sub-blocks (which may be, for example, 1 mm*1 mm). The control chip may control each sub-block, and each sub-block may be controlled to change the heat insulation/heat conduction attributes. For example, the heat insulation/heat conduction element layer may be formed by e.g., a metal plane layer, and may be transversely and vertically insulated and divided into a plurality of grids. Two electrodes may be arranged on upper and lower sides of each grid, and the two electrodes may be connected with and controlled by the control chip respectively. According to a metal conduction principle of solid state physics, free electrons mainly function for heat conduction, the free electrons may be diffused to meet a Boltzmann equation for heat transfer in a temperature field, and cold electrons and hot electrons may exchange energy to conduct heat. After the metal grids are charged, the free electrons may move along an opposite direction of a current, and when the movement direction of the free electrons is consistent with a heat propagation direction, the metal grids may promote transfer of the heat. On the contrary, when the movement direction of the free electrons is opposite to the heat propagation direction, the metal grids may hinder transfer of the heat. In such a manner, conversion of the heat conduction and heat insulation attributes may be implemented. Of course, along with development of materialogy, the substance of the plane layer of the heat insulation/heat conduction element layer may be diversified. Any substance converted between the heat insulation/heat conduction attributes may be applied to the heat insulation/heat conduction element layer as long as the substance may be controlled by the control chip, which will not be elaborated herein.

The intelligent chip of the heat insulation/heat conduction element layer may communicate with the main chip and a chip of the touch screen. The user scenario information of the main chip and the change of the capacitance value caused by proximity of a finger or face of the user may be acquired to determine a posture at which the terminal is held by the hand and the position of the face, so as to further perform heat insulation at a corresponding position. For example, if the intelligent chip acquires a current call scenario and learns from the main chip that the proximity sensor has detected a face (the control chip may read a numerical value of the sensor from the main chip), and learns from the chip of the touch screen that capacitance values of a large area change (on the basis of the principle that capacitance may be generated between two live conductors which are close to each other, since a human body and a tin indium oxide layer in the capacitive screen belong to live conductors, the capacitance value of each point on the touch screen may change when the face close to the capacitive screen, and the value may be stored in the chip of the touch screen), then a screen region close to the face may be determined. Furthermore, in combination with call scenario information, the control chip may reckon that the touch region of the hand is at a lower half part of a rear side of the terminal. Determination of these positions may determine whether each sub-block of the heat insulation/heat conduction element layer has the heat insulation attribute or the heat conduction attribute. Specifically, heat insulation may be set to be performed in regions corresponding to the hand and the face, and heat conduction may be set to be performed in regions except the hand and the face. Therefore, combination of "throttling" and "insulation" may be implemented.

In addition, when there is no hand or face approaching the terminal, the intelligent chip may dynamically regulate distribution of the heat insulation/heat conduction unit grids according to temperature difference of the heat insulation/heat conduction element layer, thereby achieving consistency of the temperature of the terminal and avoiding the phenomenon of influence of an extremely great difference on the user experience. The terminal product mainly has some major heating parts, i.e. the main chip, a charging management chip and a radio frequency power amplifier, and temperatures of these positions are inevitably higher. By heat equalization of the heat equalization element layer, a certain uniform dissipation function may be realized. However, when the heat passes through the heat equalization element layer, the temperature may not be completely uniform. Under such a condition, the heat insulation/heat conduction element layer may dynamically regulate the distribution of heat insulation/heat conduction units according to such a temperature difference. For example, the heat insulation units may be properly distributed at positions close to the heat source, heat conduction units may be placed at non-heat source positions, and thus consistency of the temperature felt by the user may be achieved. Analysis may be conducted in combination with the call scenario. During a call, the regions corresponding to the hand and the face may subject to heat insulation, so that the heat may not be transmitted or a transmitted amount may be reduced. After the call, temperatures of the units with the heat insulation attribute may be undoubtedly lower than the units with the heat conduction attribute. In order to avoid a poor user experience caused by the fact that the user feels temperature differences between the regions corresponding to the hand and the face and the regions not corresponding to the hand and the face, the intelligent chip may control grid parts with the heat conduction attribute during the call to be converted into grids with the heat insulation attribute, so as to slowly increase the temperatures of the regions with higher temperatures. The regions corresponding to the hand and the face may be completely converted from the heat insulation attribute to the heat conduction attribute, so that the heat may be rapidly dissipated, and equalization of the surface temperature of the terminal may be finally implemented.

Figure 5:
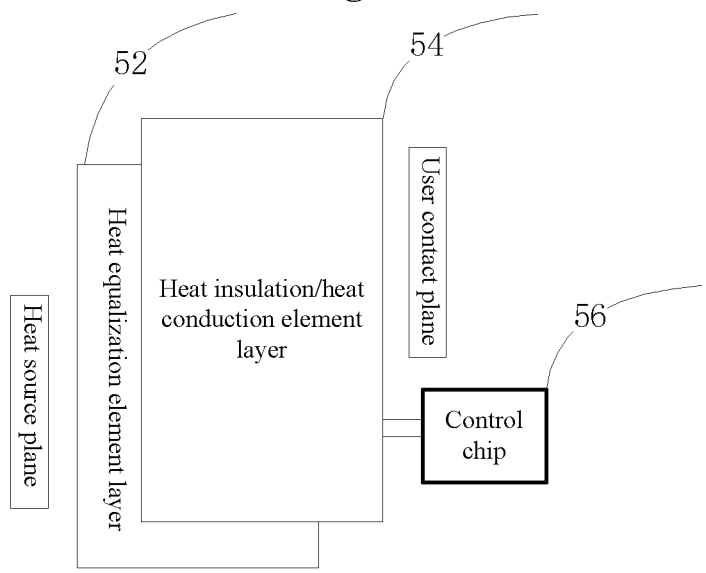
FIG. 5 is a structure diagram of an intelligent heat dissipation device according to an embodiment of the disclosure.

FIG. 5 is a structure diagram of an intelligent heat dissipation device according to an embodiment of the disclosure. As shown in FIG. 5, the novel intelligent heat dissipation device for a terminal may include a heat equalization element layer 52, a heat insulation/heat conduction element layer 54 and a control chip 56 of the heat insulation/heat conduction element layer 54.

The heat equalization element layer 52 may be close to a heat source plane, and the heat insulation/heat conduction element layer 54 may be close to a user contact plane.

The heat equalization element layer 52 may be filled with a layer of substance with a high specific heat capacity. The heat equalization element layer 52 may implement absorption of heat, may decrease a temperature rise speed by virtue of the characteristic of high specific heat capacity, and meanwhile, may equalize distribution of the heat and avoid occurrence of a very hot point.

The heat insulation/heat conduction element layer 54 may be a thin layer formed by a plurality of transversely and vertically divided grids. Each grid may be controlled by the control chip 56. Under control of the control chip, the grids may be converted between heat conduction and heat insulation attributes to implement "throttling" and "insulation" of the heat.

Figure 6:
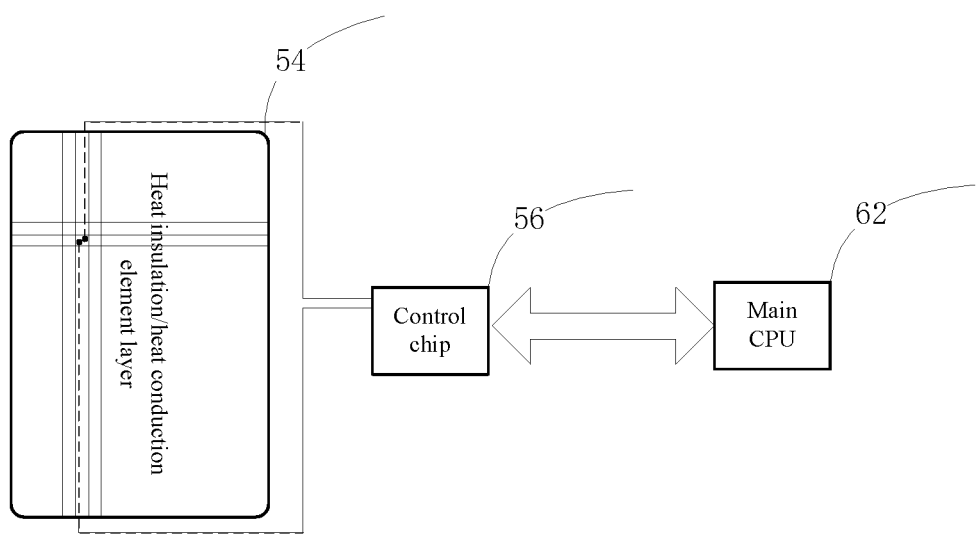
FIG. 6 is a control diagram of a heat insulation/heat conduction element layer according to an embodiment of the disclosure.

FIG. 6 is a control diagram of a heat insulation/heat conduction element layer according to an embodiment of the disclosure. The heat insulation/heat conduction element layer of the embodiment of the disclosure will be elaborated below in combination with FIG. 6.

The heat insulation/heat conduction element layer 54 may be divided into a plurality of grids by transverse and vertical spacer bars. Intervals between the spacer bars may be appropriately 1 mm (or other intervals). Positive and negative electrodes may be arranged on upper and lower sides of each unit grid. The attribute of the grid may be converted between heat insulation and heat conduction under the action of electricity.

The intelligent control chip 56 may connect the electrodes on the upper and lower sides of each grid to implement charging of each unit grid, so as to further control heat insulation and heat conduction of the attribute of the grid. The control chip 56 of the heat insulation/heat conduction element layer 54 may communicate with a Central Processing Unit (CPU) 62 of a host computer to acquire a current application scenario, a capacitance variable of a touch screen and data of a proximity sensor. The control chip 56 may analyze this data, determine positions of a hand and a face and control the attributes of the corresponding unit grids, so as to further control whether the heat is transferred or not. When there is no hand and face getting close, distribution of the heat insulation/heat conduction unit grids may be intelligently regulated according to a temperature difference of the heat insulation/heat conduction element layer 54, so as to implement temperature equalization, thereby implementing intelligent heat dissipation and improving a user experience.

Figure 7:
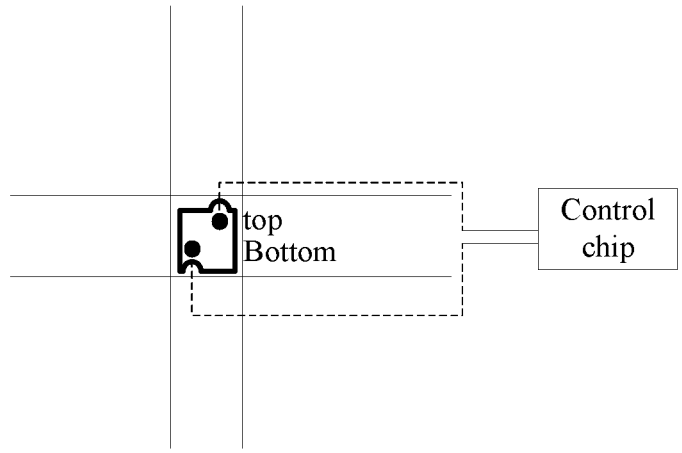
FIG. 7 is a physical connecting diagram of grid sub-blocks of a heat insulation/heat conduction element layer according to an embodiment of the disclosure.

FIG. 7 is a physical connecting diagram of grid sub-blocks of a heat insulation/heat conduction element layer according to an embodiment of the disclosure. FIG. 7 is a partially amplified diagram of FIG. 6. Each grid sub-block may be a metal block, and an upper surface and a lower surface may be connected with the control chip. According to a solid heat conduction principle, free electrons mainly function for heat conduction, and cold electrons and hot electrons may collide to implement transfer of the heat. By charging the free electrons, the free electrons may be controlled to flow, so as to control transfer of the heat to implement conversion of the heat insulation/heat conduction attributes. When heat insulation is required, that is, the heat of the lower surface is required not to be transferred to the upper surface, the free electrons may be required to be transferred from the upper surface to the lower surface, and therefore, the lower surface may need to be positively charged and the upper surface may need to be negatively charged, so as to implement bottom-to-top flowing of a current, thereby implementing top-to-bottom movement of the free electrons (the direction of the current is opposite to a movement direction of the free electrons). When heat conduction is required, the free electrons may need to move from the lower surface to the upper surface, and the current may be required to flow from bottom to top, that is, the control chip may need to control that the upper surface is positively charged and the lower surface is negatively charged.

Figure 8:
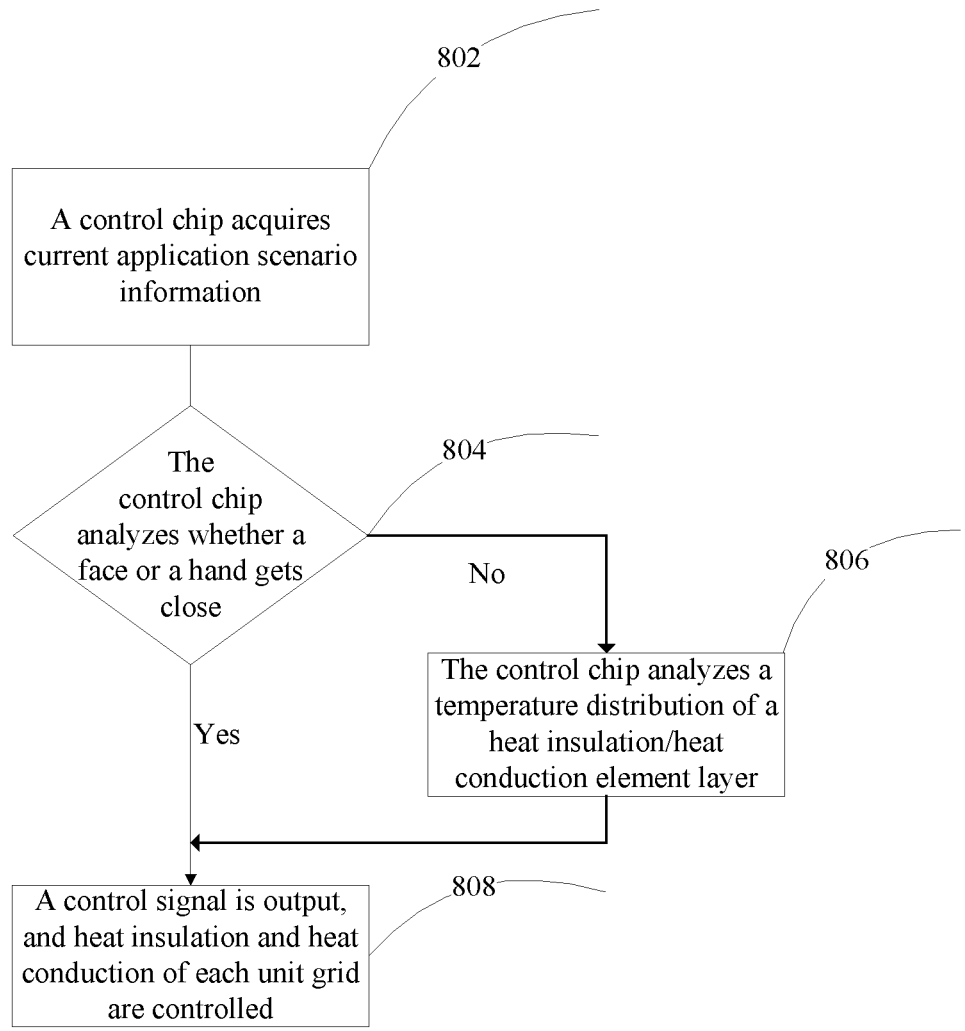
FIG. 8 is a working flowchart of a heat insulation/heat conduction element layer according to an embodiment of the disclosure.

FIG. 8 is a working flowchart of a heat insulation/heat conduction element layer according to an embodiment of the disclosure. As shown in FIG. 8, the flow may include the following acts:

At act S802, a control chip may communicate with a main chip to acquire current scenario information, including current application information, a variable of a capacitance value of a touch screen and a variable of a proximity sensor.

At act S804, the control chip may analyse the acquired information, determine whether a hand and a face get close, determine positions of the hand and the face, turn to act S808 when determining that the hand and the face get close, and otherwise turn to act S806.

At act S806, the control chip may analyse a temperature distribution of a heat insulation/heat conduction element layer.

At act 808, the control chip may output a control sequence (or a control signal) to control heat insulation and heat dissipation of each grid, thereby implementing intelligent heat transfer and improving a user experience.

The disclosure will be described below in combination with specific scenarios.

Figure 9:
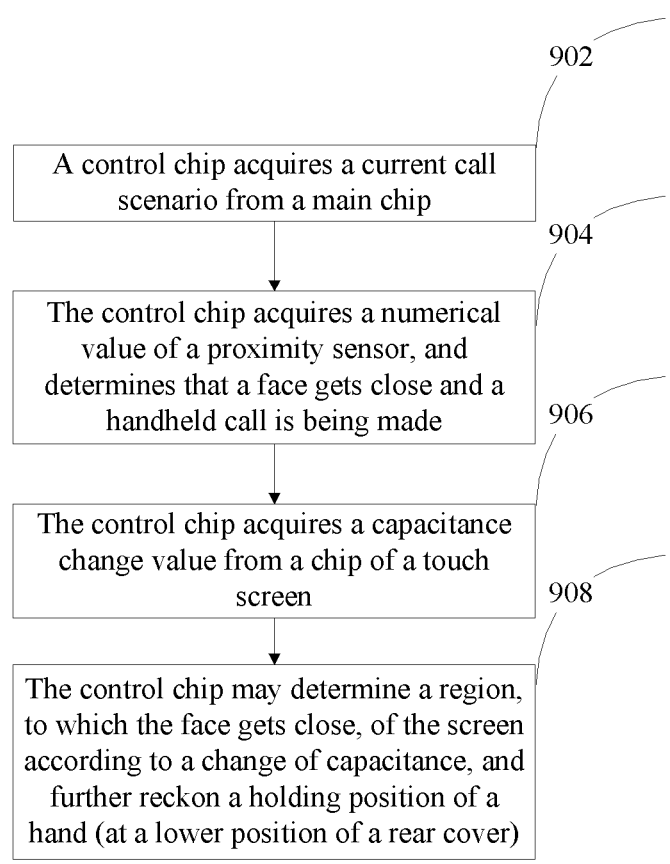
FIG. 9 is a flowchart of a call application scenario according to an embodiment of the disclosure.

FIG. 9 is a flowchart of a call application scenario according to an embodiment of the disclosure. The device of the disclosure may be arranged on both sides of a main board of an intelligent machine. A heat equalization element layer may be arranged on a side close to the main board, and a heat insulation/heat conduction element layer may be arranged on a side far away from the main board. As shown in FIG. 9, the flow may include the following acts:

At act S902, a control chip may acquire that a current scenario is a call scenario from a main chip.

At act S904, the control chip may acquire data of a proximity sensor, determine that the proximity sensor has detected that an object gets close (the control chip may acquire a change of a numerical value of the proximity sensor from the main chip), and may determine that a user is making a voice call while holding a terminal. A capacitance value may change when a face gets close to a capacitive screen (on the basis of the principle capacitance may be generated between two live conductors which are close to each other).

At act S906, the control chip may communicate with a chip of the touch screen to acquire a capacitance change value.

At act S908, the control chip may acquire a change of a capacitance value of this region according to the capacitance change value to determine the specific region to which the face gets close. Then the control chip may reckon a projection region of the hand on a rear cover in combination with the call scenario. The region to which the face gets close and the projection region of the hand on the rear cover may both become regions filled with heat insulation units. The control chip may output a control signal to regulate a change of heat insulation/heat conduction regions, thereby controlling temperatures of the regions to which the hand and face of the user get close and improving a user experience.

When there is no face or hand approaching the terminal after the call has been made, the control chip may acquire a temperature distribution of the heat insulation/heat conduction element layer. If a certain region of the heat insulation/heat conduction element layer is hotter, the temperature may be controlled to rise by adding heat insulation units. For a lower-temperature region of the heat insulation/heat conduction element layer, heat conduction units may be added or may be all turned on to implement rapid dissipation of heat, thereby making the temperature felt by the user of the terminal consistent.

Figure 10:
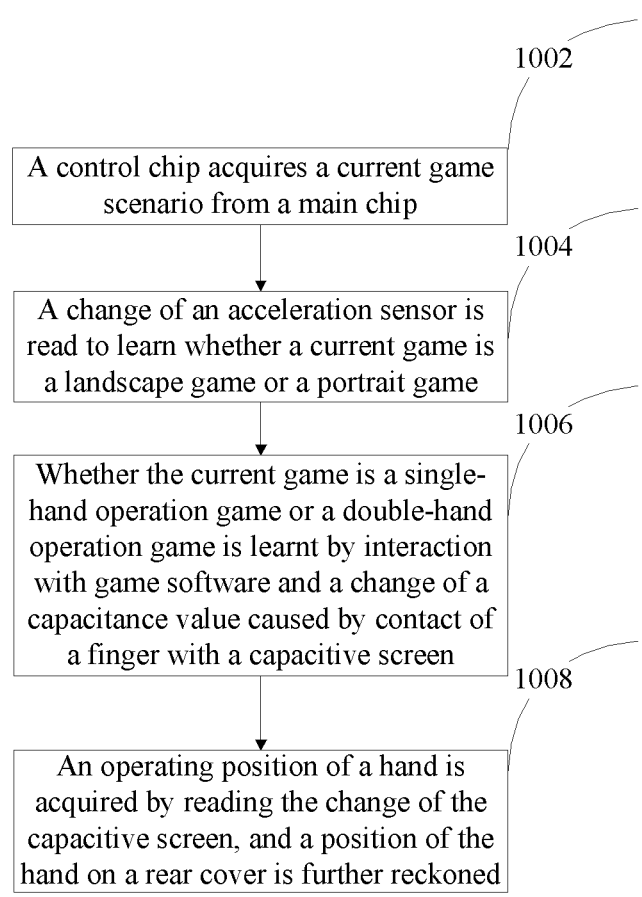
FIG. 10 is a flowchart of a game application scenario according to an embodiment of the disclosure.

FIG. 10 is a flowchart of a game application scenario according to an embodiment of the disclosure. The device of the disclosure may be arranged on both sides of a main board of an intelligent machine. A heat equalization element layer may be arranged on a side close to the main board, and a heat insulation/heat conduction element layer may be arranged on a side far away from the main board. As shown in FIG. 10, the flow may include the following acts:

At act S1002, a control chip may acquire that a current scenario is a game scenario from a main chip.

At act S1004, the control chip may determine that a game is a landscape game or a portrait game in combination with change of acceleration.

At act S1006, the control chip may learn that the current game is a single-hand game or a double-hand game by interaction with game software and a change of a capacitance value caused by contact of a finger with a capacitive screen.

At act S1008, the finger may contact with the capacitive screen to cause the change of the capacitance value. The control chip may acquire the information, determine a position and shape of the finger according to the change of the capacitance value, and may reckon that the finger is a left finger or a right finger, reckon a holding region of a hand, and determine a region with a heat insulation requirement.

The control chip may output a control sequence, and regulate a change of heat insulation/heat conduction regions, thereby forming intelligent heat dissipation. When there is no hand and face getting close to the terminal after the game, the control chip may also intelligently regulate a distribution of heat insulation/heat conduction units according to a temperature distribution, thereby achieving consistency of a surface temperature of the terminal.

In an embodiment, intelligent heat dissipation of the terminal may be implemented by adopting the modular concept and in combination with heat "throttling" and "insulation". The heat equalization element layer may be adopted to decrease the temperature rise speed and equalize hot points to avoid occurrence of the extremely hot point. Meanwhile, the intelligent chip of the heat insulation/heat conduction element layer may communicate with the main chip and the chip of the touch screen to learn about the application scenario information of the user and further reckon the positions of the hand and the face, and control filling of a heat insulation material or a heat conduction material to implement intelligent transmission of the heat. If there is no face and hand getting close, the intelligent chip may intelligently regulate the heat insulation/heat conduction units according to the temperature difference of the heat insulation/heat conduction element layer, thereby remarkably improving the user experience.

It is important to note that each module may be implemented through software or hardware, and under the latter condition, may be implemented in, but not limited to, the following manner. The modules may all be positioned in the same processor, or the modules may be positioned in multiple processors respectively.

An embodiment of the disclosure provides a storage medium. In an embodiment, the storage medium may be configured to store program codes configured to execute the following acts.

At act S1, a distance or distances between one or more regions of a terminal and a predetermined detection object may be detected.

At act S2, heat insulation processing may be performed in a first region of the terminal, where the first region may be a region of which the distance to the predetermined detection object is smaller than a first predetermined threshold; and/or, heat dissipation processing may be performed in a second region of the terminal, where the second region may be a region of which the distance to the predetermined detection object is larger than a second predetermined threshold.

In an embodiment, the storage medium may include, but not limited to: various media capable of storing program codes such as a U disk, a ROM, a RAM, a mobile hard disk, a magnetic disk or an optical disk.

In an embodiment, specific examples in the embodiment may refer to examples described in the abovementioned embodiments and optional implementation modes, and will not be elaborated in the embodiment.

Obviously, those skilled in the art should know that each module or each act of the disclosure may be applied to all heat dissipation fields. The disclosure may be integrally applied to the terminal product, may alternatively be separately used, and may further be combined for use. For example, a metal backboard or graphite heat conduction layer of an LCD may be used as the heat equalization layer, and the heat insulation and heating element layer is independently used. For example, the modules may be combined for use. For example, for an intelligent machine product, the device of the disclosure may be arranged between the LCD and a main board and the device of the disclosure may be arranged between the main board and the rear cover. Of course, the control chip may be combined for integral control. In such a manner, the disclosure is not limited to any specific structure combination. Moreover, each module or each act of the disclosure may be implemented by a universal computing device, and the modules or acts may be concentrated on a single computing device or distributed on a network formed by multiple computing devices, and may optionally be implemented by program codes executable for the computing devices, so that the modules or acts may be stored in a storage device for execution with the computing devices, the shown or described acts may be executed in sequences different from those shown or described here in some circumstances, or may form each integrated circuit module respectively, or multiple modules or acts therein may form a single integrated circuit module for implementation. As a consequence, the disclosure is not limited to any specific hardware and software combination.

The above is only the preferred embodiment of the disclosure and not intended to limit the disclosure. For those skilled in the art, the disclosure may have various modifications and variations. Any modifications, equivalent replacements, improvements and the like made within the principle of the disclosure shall fall within the scope of protection defined by the appended claims of the disclosure.

INDUSTRIAL APPLICABILITY

The technical solutions provided by the disclosure may be applied to a heat control process. The distance or distances between the one or more regions of the terminal and the predetermined detection object may be detected. Heat insulation processing may be performed in the first region of the terminal, where the first region is the region of which the distance to the predetermined detection object is smaller than the first predetermined threshold; and/or, heat dissipation processing may be performed in the second region of the terminal, where the second region is the region of which the distance to the predetermined detection object is larger than the second predetermined threshold. A problem of incapability in solving heating of a terminal product may be solved, and an effect of effectively solving a problem of heating of the terminal product may be achieved.

What is claimed is:

1. A heat control method, comprising:
   detecting a distance or distances between one or more regions of a terminal and a predetermined detection object;
   further comprising:
   performing heat insulation processing in a first region of the terminal, wherein the distance between the predetermined detection object and the first region is smaller than a first predetermined threshold; or,
   performing heat dissipation processing in a second region of the terminal, wherein the distance between the predetermined detection object and the second region is larger than a second predetermined threshold.

2. The method as claimed in claim 1, wherein performing heat insulation processing in the first region of the terminal comprises:
   performing stepped heat insulation processing in the first region according to distances to the predetermined detection object.

3. The method as claimed in claim 2, wherein performing stepped heat insulation processing in the first region according to the distances to the predetermined detection object comprises:
performing stepped heat insulation processing in a manner of respectively controlling each grid sub-block in the first region, wherein the first region comprises a predetermined number of grid sub-blocks, and electrodes configured to control heat are arranged in the grid sub-blocks.

4. The method as claimed in claim 3, wherein detecting the distance or distances between the one or more regions of the terminal and the predetermined detection object comprises:
determining the distance or distances between the one or more regions of the terminal and the predetermined detection object based on a change of a numerical value in a proximity sensor or a change of a numerical value in a capacitive sensor.

5. The method as claimed in claim 3, wherein an electrode is arranged on each of upper and lower sides of each grid sub-block, and heat insulation or heat dissipation processing is performed by virtue of migration of electrons between the electrodes.

6. The method as claimed in claim 2, wherein detecting the distance or distances between the one or more regions of the terminal and the predetermined detection object comprises:
determining the distance or distances between the one or more regions of the terminal and the predetermined detection object based on a change of a numerical value in a proximity sensor or a change of a numerical value in a capacitive sensor.

7. The method as claimed in claim 1, after detecting a distance or distances between the one or more regions of a terminal and a predetermined detection object:
when a distance between each region of the terminal and the predetermined detection object is larger than a third predetermined threshold, performing heat equalization processing in the terminal.

8. The method as claimed in claim 7, wherein detecting the distance or distances between the one or more regions of the terminal and the predetermined detection object comprises:
determining the distance or distances between the one or more regions of the terminal and the predetermined detection object based on a change of a numerical value in a proximity sensor or a change of a numerical value in a capacitive sensor.

9. The method as claimed in claim 1, wherein detecting the distance or distances between the one or more regions of the terminal and the predetermined detection object comprises:
determining the distance or distances between the one or more regions of the terminal and the predetermined detection object based on a change of a numerical value in a proximity sensor or a change of a numerical value in a capacitive sensor.

10. A terminal having a main Central Processing Unit (CPU), comprising:
a detection module, configured to detect a distance or distances between one or more regions of the terminal and a predetermined detection object;
further comprising:
a first processing module, configured to perform heat insulation processing in a first region of the terminal, wherein the distance between the predetermined detection object and the first region is smaller than a first predetermined threshold; or,
a second processing module, configured to perform heat dissipation processing in a second region of the terminal, wherein the distance between the predetermined detection object and the second region is larger than a second predetermined threshold.

11. The device as claimed in claim 10, wherein the first processing module comprises:
a control chip, configured to perform stepped heat insulation processing in the first region according to distances to the predetermined detection object.

12. The device as claimed in claim 11, wherein the control chip is configured to:
perform stepped heat insulation processing in a manner of respectively controlling each grid sub-block in the first region, wherein the first region comprises a predetermined number of grid sub-blocks, and electrodes configured to control heat are arranged in the grid sub-blocks.

13. The device as claimed in claim 12, wherein the detection module is configured to:
determine the distance or distances between the one or more regions of the terminal and the predetermined detection object based on a change of a numerical value in a proximity sensor or a change of a numerical value in a capacitive sensor.

14. The device as claimed in claim 11, wherein the detection module is configured to:
determine the distance or distances between the one or more regions of the terminal and the predetermined detection object based on a change of a numerical value in a proximity sensor or a change of a numerical value in a capacitive sensor.

15. The device as claimed in claim 10, further comprising:
a third processing module, configured to, when a distance between each region of the terminal and the predetermined detection object is larger than a third predetermined threshold, perform heat equalization processing in the terminal.

16. The device as claimed in claim 15, wherein the detection module is configured to:
determine the distance or distances between the one or more regions of the terminal and the predetermined detection object based on a change of a numerical value in a proximity sensor or a change of a numerical value in a capacitive sensor.

17. The device as claimed in claim 10, wherein the detection module is configured to:
determine the distance or distances between the one or more regions of the terminal and the predetermined detection object based on a change of a numerical value in a proximity sensor or a change of a numerical value in a capacitive sensor.

18. An intelligent heat dissipation device, comprising: a heat equalization element layer, a heat insulation and heat conduction element layer and a control chip of the heat insulation and heat conduction element layer, wherein
the heat equalization element layer is filled with a layer of substance with a high specific heat capacity for implementing absorption of heat;
the heat insulation and heat conduction element layer is a layer, of which a thickness is smaller than a predetermined value, formed by a plurality of transversely and vertically divided grids, and the control chip is configured to control each grid to convert between heat conduction and heat insulation attributes.

19. The intelligent heat dissipation device as claimed in claim 18, wherein positive and negative electrodes are arranged on upper and lower sides of each grid, and the control chip is configured to convert an attribute of the grid between heat insulation and heat conduction under action of electricity.

20. The intelligent heat dissipation device as claimed in claim 19, wherein the control chip connects the positive and negative electrodes on the upper and lower sides of each grid to implement charging of each unit grid, so as to further control heat insulation and heat conduction of the attribute of the grid.

* * * * *